United States Patent [19]

Blake et al.

[11] Patent Number: 5,444,597
[45] Date of Patent: Aug. 22, 1995

[54] WAFER RELEASE METHOD AND APPARATUS

[76] Inventors: Julian G. Blake, 211 Hart St., Beverly Farms, Mass. 01915; Weilin Tu, 6 Oak St., Natick, Mass. 01760

[21] Appl. No.: 29,154

[22] Filed: Mar. 10, 1993

Related U.S. Application Data

[63] Continuation-in-part of Ser. No. 5,030, Jan. 15, 1993.

[51] Int. Cl.⁶ .............................................. H02N 13/00
[52] U.S. Cl. .................................................. 361/234
[58] Field of Search ............... 361/230, 233, 234, 235;
437/8; 324/713, 715, 718, 724, 158 F, 158 P;
279/126, 128; 29/900; 248/309.3, 309.4; 269/8,
903

[56] References Cited

U.S. PATENT DOCUMENTS

| | | | |
|---|---|---|---|
| 4,184,188 | 1/1980 | Briglia | 361/234 |
| 4,384,918 | 5/1983 | Aba | 361/234 X |
| 4,665,463 | 5/1987 | Ward et al. | 361/234 |
| 4,751,609 | 6/1988 | Kasahara | 361/234 |
| 4,864,461 | 9/1989 | Kasahara | 361/234 |
| 4,962,441 | 10/1990 | Collins | 361/234 |
| 5,103,367 | 4/1992 | Horwitz et al. | 361/234 |
| 5,117,121 | 5/1992 | Watanabe et al. | 361/234 X |
| 5,173,834 | 12/1992 | Sagoh | 361/234 |
| 5,179,498 | 1/1993 | Hongola et al. | 361/234 |
| 5,184,398 | 2/1993 | Moslehi | 361/239 X |
| 5,315,473 | 5/1994 | Collins et al. | 361/234 |
| 5,325,261 | 6/1994 | Horwitz | 361/234 |

FOREIGN PATENT DOCUMENTS

| | | |
|---|---|---|
| 0460955 | 6/1991 | European Pat. Off. . |
| 0460954A1 | 12/1991 | European Pat. Off. . |
| 0552877A1 | 7/1993 | European Pat. Off. . |
| 2676603 | 5/1992 | France . |

OTHER PUBLICATIONS

European Search Report for European Application No. EP943016063.

*Primary Examiner*—A. D. Pellinen
*Assistant Examiner*—Fritz M. Fleming

[57] ABSTRACT

A wafer position and clamp sensor. A circuit monitors capacitance between two electrodes within a wafer support. With no wafer on the support, the capacitance falls in one range, with the wafer in place but not clamped, the capacitance falls in a second range and with the wafer held in place by an electrostatic attraction the capacitance falls in a third range. The sensed capacitance is converted to a frequency and then a D.C. voltage level that can easily be sensed and used to confirm wafer placement and then wafer clamping. After the wafer has been treated, the wafer is removed and a next subsequent wafer treated. A clamping voltage applied to clamp the wafer to its support is reversed at a controlled frequency to release the wafer. The voltage reversal disrupts the electrostatic attraction between the wafer and its support.

17 Claims, 7 Drawing Sheets

WAFER RELEASE METHOD AND APPARATUS

CROSS-REFERENCE TO RELATED APPLICATIONS

The present application is a continuation-in-part (CIP) application of application Ser. No. 08/005,030 to Blake et al. entitled "Wafer Sensing and Clamping Monitor" that was filed in the U.S. Patent and Trademark Office on Jan. 15, 1993.

FIELD OF THE INVENTION

The present invention concerns an electrostatic clamp for holding a semiconductor wafer against a wafer support and more particularly to a method and apparatus for controlling operation of such a clamp.

BACKGROUND ART

U.S. Pat. No. 5,103,367, entitled *Electrostatic Chuck Using A.C. Field Excitation* relates to a mechanism for holding semiconductor wafers in contact with a support during treatment of the wafers. The electrostatic chuck has three electrodes where two electrodes define a substantially planar surface and are embedded within a thin dielectric film. These two electrodes are excited by a low-frequency (approximately 200 hertz) A.C. supply to produce sign wave fields of controlled amplitude and phase. The third electrode accesses a shield electrode that serves as a reference point for the other two electrodes. By controlled rates of voltage application and removal, low-voltage gradients are obtained on the wafer support. This results in no retentive forces between the dielectric medium and the wafer. A low alternating current amplitude excitation of the chuck enables capacitative current sensing of the relative positions of the wafers and the dielectric film enabling simple control of voltage application to the electrodes.

A common problem associated with electrostatic clamping is that the wafer may not release from the clamp when the holding voltage that is applied to the clamp is turned off. There are several factors which can contribute to this residual clamping force.

First, most dielectrics can exhibit a degree of semipermanent polarization following exposure to an intense electric field. This polarization has the effect of maintaining the clamping force even after the applied voltage is removed. Materials with a high dielectric constant are particularly prone to this effect, and it is exactly such materials which are favored as the dielectric material for a wafer support because their high dielectric constant provides an enhancement of the clamping force.

Second, stored elastic energy in the clamp can result in a residual clamping force, even were the dielectric a perfect material without any residual polarization. For example, in the case where an elastomer is part of the clamp structure, the capacitance of the clamp becomes voltage dependent. This makes discharge of the series of capacitors which comprise the clamp impossible by simple shorting the voltage supply. Rather, the stored energy must be dissipated in an external circuit. Because the clamp circuitry is not a simple D.C. source but contains capacitance and inductance, simple shorting through an external circuit to extract the stored energy will not work.

DISCLOSURE OF THE INVENTION

The present invention concerns method and apparatus for handling a semiconductor wafer before and after ion beam treatment of the wafer. Prior to treatment, the semiconductor wafer is secured to a wafer support by creating an electrostatic attraction between the wafer and the support. The wafer is next typically moved to a treatment station and then returned to a loading station and removed from the support.

As the wafer is being treated, the wafer and wafer support attract each other due to mutual electrostatic attraction. This is most preferably accomplished by energizing electrodes positioned within the wafer support. A power supply biases the electrodes to create this electrostatic attraction.

After the wafer has been treated, the output polarity of the power supply is switched at a controlled rate to reduce the attraction between the wafer and the wafer support. This allows the wafer to be removed from its support by mechanical wafer handling apparatus known in the prior art. The controlled switching can be accompanied by a gradual reduction in amplitude of the potential difference applied across the support electrodes. By diminishing the attraction between the wafer and support, the wafer can be moved without damage, thereby increasing efficiency of the ion implanter.

It is possible that a residual attraction between wafer and wafer support experienced in prior art wafer treatment systems is caused by charge stored in the wafer support. From review of the structure and construction of the electrostatic clamping, the support can be defined as multiple capacitors in series. Different capacitors demonstrate different dielectric constants from different material layers. All capacitors cannot be fully discharged with by simply shorting the wafer support since the discharge current will stop flowing once a certain equilibrium is reached internally (one capacitor becomes a charging source to another during the process). Practice of the invention keeps up sufficient discharge current until the remaining charge is negligible.

A decayed amplitude in bias voltage can be approximated by applying frequency modulation—switching voltage polarity of the power supply (across the two support electrodes) with a variable frequency from low to high. This technique is based upon the fact that the capacitors are not ideal, which have effectively "lossy" dielectric constants due to the elastomer material of the wafer support. This "exercising" the capacitors causes the dissipation of the stored energy.

From the above, it is appreciated that one object of the invention is an ion implantation apparatus and method for facilitating wafer handling while maintaining control over the wafer. This is most preferably accomplished by a wafer release apparatus and method constructed and performed in accordance with the disclosed and claimed invention. This, and other objects, advantages and features of the invention will become better understood from a detailed description of the preferred embodiment of the invention which is described in conjunction with the accompanying drawings.

BRIEF DESCRIPTION OF THE DRAWINGS

FIGS. 4 and 4A are schematics of a capacitance sensing circuit;

BEST MODE FOR PRACTICING THE INVENTION

Figure 1:
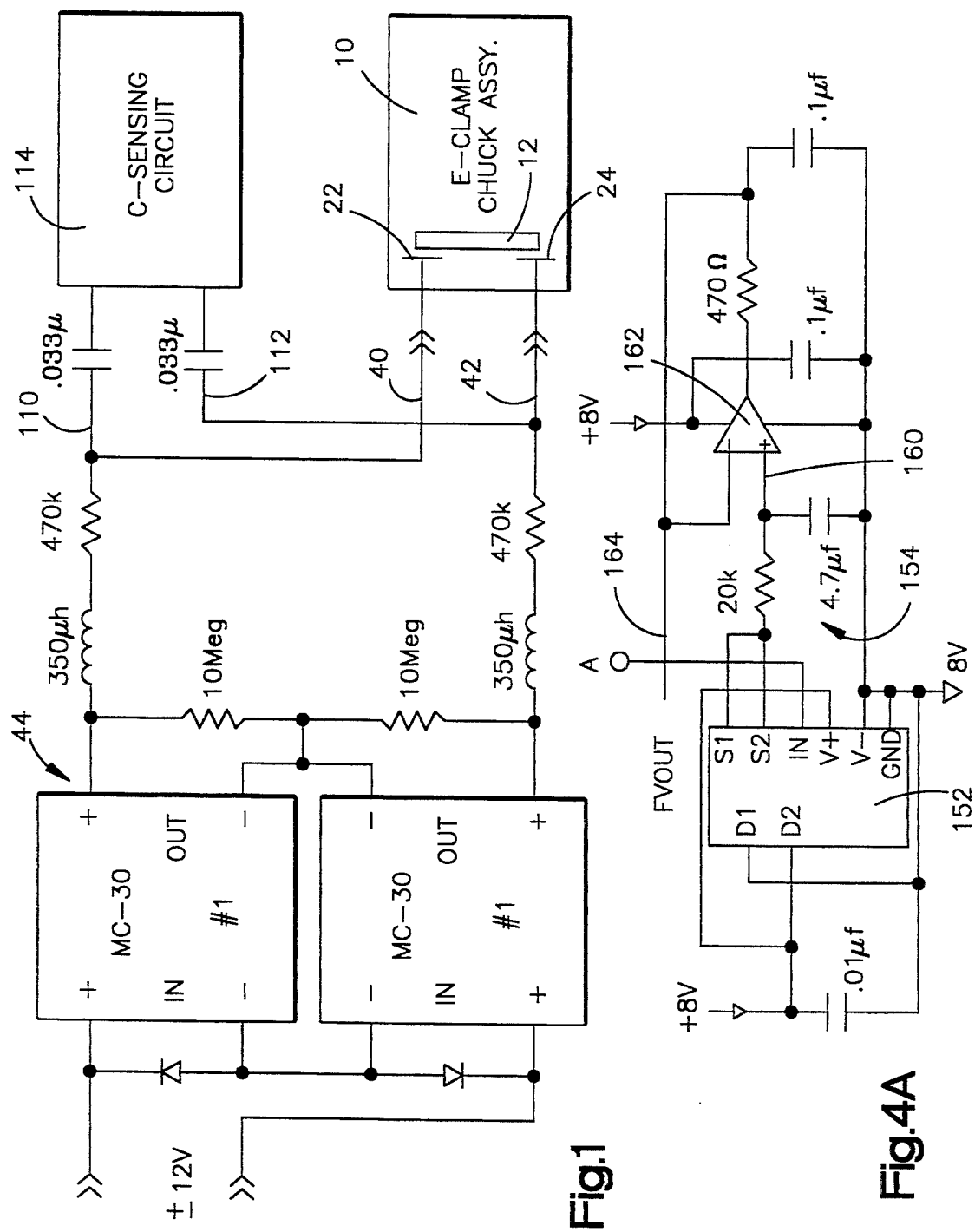
FIG. 1 is a schematic of a power supply, electrostatic clamp assembly and capacitance measuring circuit.

The drawings illustrate a clamp assembly 10 for supporting and holding a semiconductor wafer 12 (FIG. 3) for processing. The clamp assembly 10 includes a backing plate 14 which is preferably formed of alumina or molybdenum, a base member 16 also formed of alumina, a dielectric layer 18 of glass, and a dielectric layer 20 of alumina. Electrodes 22, 24 are interposed between the glass layer 18 and the dielectric layer 20 and a heating element 26 is interposed between the glass layer and the base member 16.

A gas fitting 28 extends through the chuck assembly opening into the interface between the wafer and the layer 20 to provide gas conduction cooling between the wafer and the chuck as described in U.S. Pat. No. 4,261,762. A gas distribution groove 29 is formed in the top surface of layer 20 to aid in the distribution of the gas.

The base member 16 defines a manifold having a channel 30 for the flow of a cooling fluid. In the preferred embodiment shown, the channel is formed as a spiral; however, it can also follow a meandering path or it can be a series of interconnected channels. The channels are closed to define an enclosed conduit or conduits by means of the backing plate 14, which is sealed against the manifold. Openings are provided in the backing plate for a coolant inlet fitting 32 and a coolant outlet fitting 34. Since the present chuck assembly is intended to perform under a wide range of temperature conditions, the cooling medium flowing through the manifold can be either a liquid or a gas, depending on the application.

Clamp Construction

Figure 2:
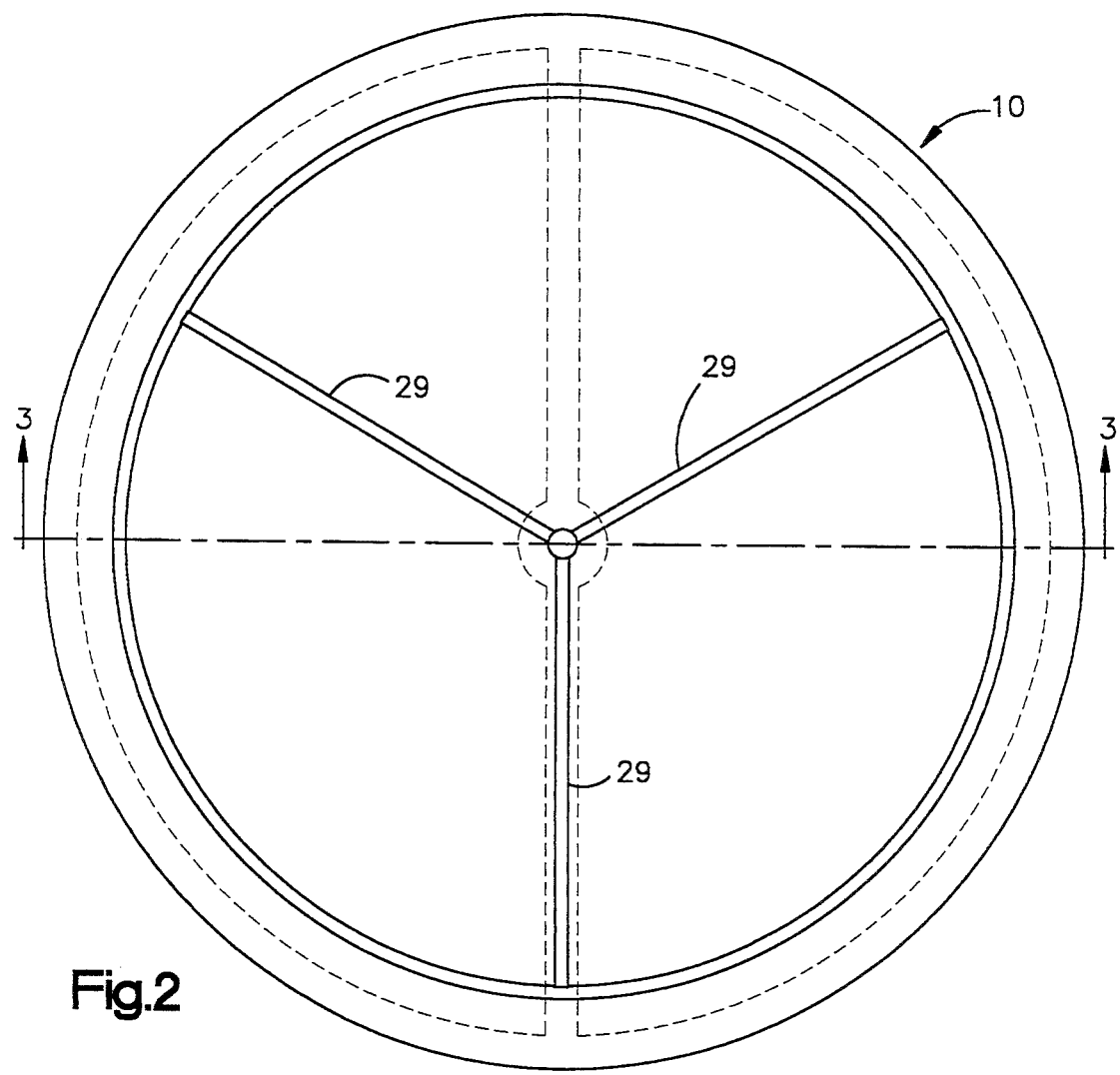
FIG. 2 is a plan view of a wafer support used in an ion implanter.

The dielectric layer 20 is preferably formed of a thin (about 0.25 mm) layer of high purity (99.5%) alumina. The electrodes 22 and 24 are then formed on the bottom (as seen in FIG. 2) surface of the dielectric layer, preferably by screen printing a paste of powdered copper aluminum or silver palladium metals and glass frit onto the dielectric layer and then firing it at about 700° C. As shown in FIG. 1, the electrodes are essentially half circular in plan view.

Figure 3:
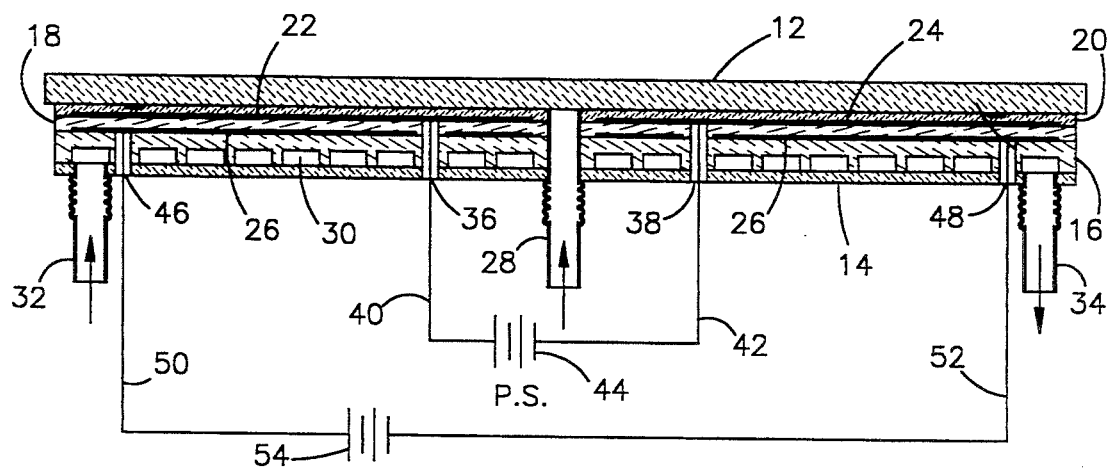
FIG. 3 is a view as seen from the plane 3—3 in FIG. 2.

The heating element 26 is formed by screen printing a paste of powdered tungsten and glass onto the manifold in the form of a continuous meander, the geometry of the meander preferably being as shown in FIG. 3 to provide a higher heater power density at the outer edge to optimize temperature uniformity across the chuck.

Once the electrodes 22, 24 and heating element 26 are fired onto the dielectric layer, the layer 20 is bonded to the manifold. After the above assembly is complete, the backing plate 14 is furnace brazed or sealed by means of a sealing glass to the bottom of the manifold 16.

As shown schematically in FIG. 3, access holes 36, 38 are formed through the backing plate 14, the manifold 16 and the dielectric layer 18 for a first conductor 40 connected to the electrode 22 and for a second conductor 42 connected to the electrode 24. The conductors 40, 42 are attached to the electrodes by brazing or other convenient methods such as by providing spring contacts engageable with the electrodes and are connected to a power supply 44 (FIG. 1) which provides a signal of about 3 kilovolts DC to create the electrostatic clamping force to a semiconductor wafer 12 placed on the surface of the dielectric layer 20. The power supply 44 includes two modules 44a, 44b which are coupled together to provide a bi-polar output.

Access holes 46, 48 are also formed through the backing plate 14 and the manifold 16 for a third conductor 50 attached to one terminal of heating element 26 also by brazing or the like, and fourth conductor 52 similarly attached to the other terminal of heating element 26 to connect the heating element to a second power source 54, typically operating at 120 volts. Preferably, the access holes 36, 38 and the hole for the gas fitting 28 are machined into the structure with the holes 36, 38 sealed with sealing glass and the fitting bonded into its hole with sealing glass.

Capacitance Sensing Circuit

As seen in FIG. 1, two inputs 110, 112 from the electrodes 22, 24 are coupled to a capacitive sense circuit 114. A capacitance across these two inputs 110, 112 corresponds to the capacitance between the electrodes 22, 24 and is influenced by the presence of a wafer as well as the voltage applied to the electrodes. These two inputs are coupled to an operational amplifier 120 within an integrated circuit 122. The integrated circuit is a commercially available circuit designated LF 356 and can be obtained from National Semiconductor.

The operational amplifier 120 generates an output which oscillates with a frequency directly related to the capacitance between the inputs 110, 112.

The oscillating output signal from the operational amplifier 120 varies between 0 and 5 volts. This signal is shaped and then coupled to a comparator amplifier 130 having a reference input 132 defined by a zener diode 134 at approximately 5 volts. The comparator amplifier 130 creates a square wave signal output having a 50% duty cycle having an ON period that varies depending on the sensed capacitance. For a 4-inch circular diameter wafer, this period is approximately 20 microseconds with no wafer in place, 30 microseconds with a wafer placed on the layer 20, and 40 microseconds with the wafer in place and a clamping voltage (approximately 3 kilovolts) applied to the electrodes by the power supply 44. In the event application of the 3 kilovolt clamping voltage does not sufficiently increase the capacitance between the electrodes 22, 24 the signal output from the comparator will have a period less than 40 microseconds.

An output from the comparator amplifier 130 turns on and off light-emitting diodes 140, 142 which are optoisolated from corresponding photodetectors. A top photodetector 144 is used for diagnostic purposes and an output 148 from the detector 144 can be coupled to an oscilloscope, for example, for monitoring frequency changes with capacitance.

Figure 4:
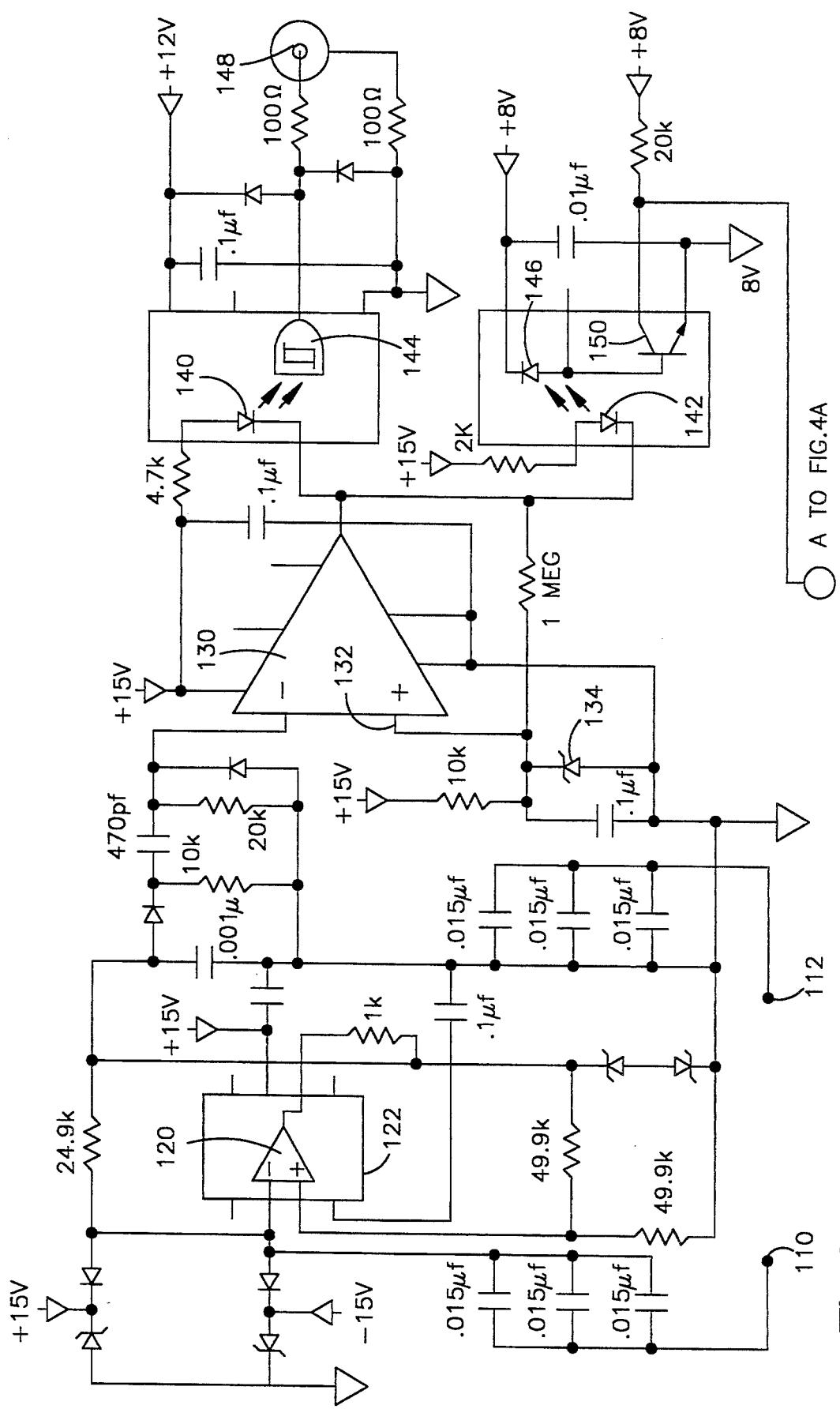

A second photodetector 146 generates a signal which turns on and off a transistor 150 which is coupled to an analog switch 152 (FIG. 4A). This analog switch 152 has in input (IN) coupled to the collector of the transistor 150. As the transistor turns on and off, outputs (S1, S2) of the switch 152 sequentially change state from ground to 8 volts in accordance with the square wave frequency output from the comparator 130.

The output from the analog switch 152 is integrated by a resistor, capacitor circuit 154 so that the input to a non-inverting input 160 of an operational amplifier 162 is a voltage level directly related to the capacitance sensed by the circuit 114. This operational amplifier 162 operates as a voltage follower so that an output 164 designated FVOUT is a DC output signal directly related to sensed capacitance. This DC output signal is used by an implanter control system 250 (FIG. 6) to monitor performance of the system. The wafer handler for depositing a wafer onto the chuck is activated in response to an appropriate no wafer condition being sensed. Once the wafer is sensed, an output from the control circuit 250 activates the DC power supply 44 to energize the electrodes 22, 24 causing an electrostatic attraction between the clamp and the wafer. The sensor circuit 114 senses an attraction produced by the power supply based upon sensed capacitance between the electrodes once the clamping voltage has been applied to the electrodes by the power supply.

Figure 5:
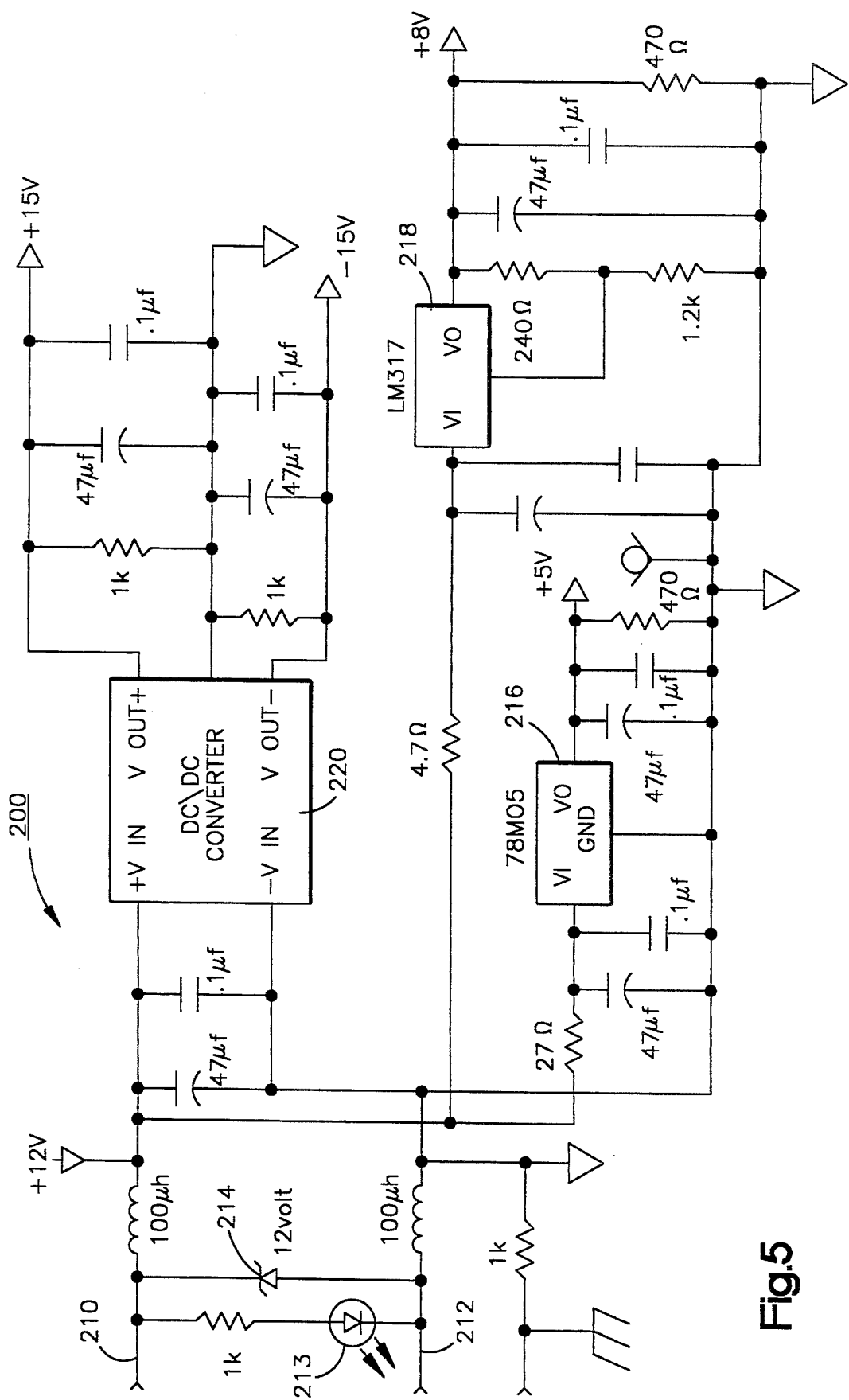
FIG. 5 is a power supply circuit for energizing the sensing circuit of FIGS. 4 and 4A.

Turning to FIG. 5, this figure discloses a power supply circuit 200 for generating voltages appropriate for the capacitance monitoring circuit 114. Two inputs 210, 212 at the left of FIG. 5 provide a voltage which energizes a light-emitting diode 213. This voltage produces a 12-volt signal due to the voltage clamping operation of a zener diode 214. The 12-volt signal is then coupled to integrated circuit voltage regulators 216, 218 for producing +8 and +5 volts. A DC to DC converter 220 provides plus and minus 15-volt signals. These voltages are applied to the circuitry of FIGS. 4, 4A for providing the capacitance sensing capability of the present invention.

Wafer Release

Figure 6:
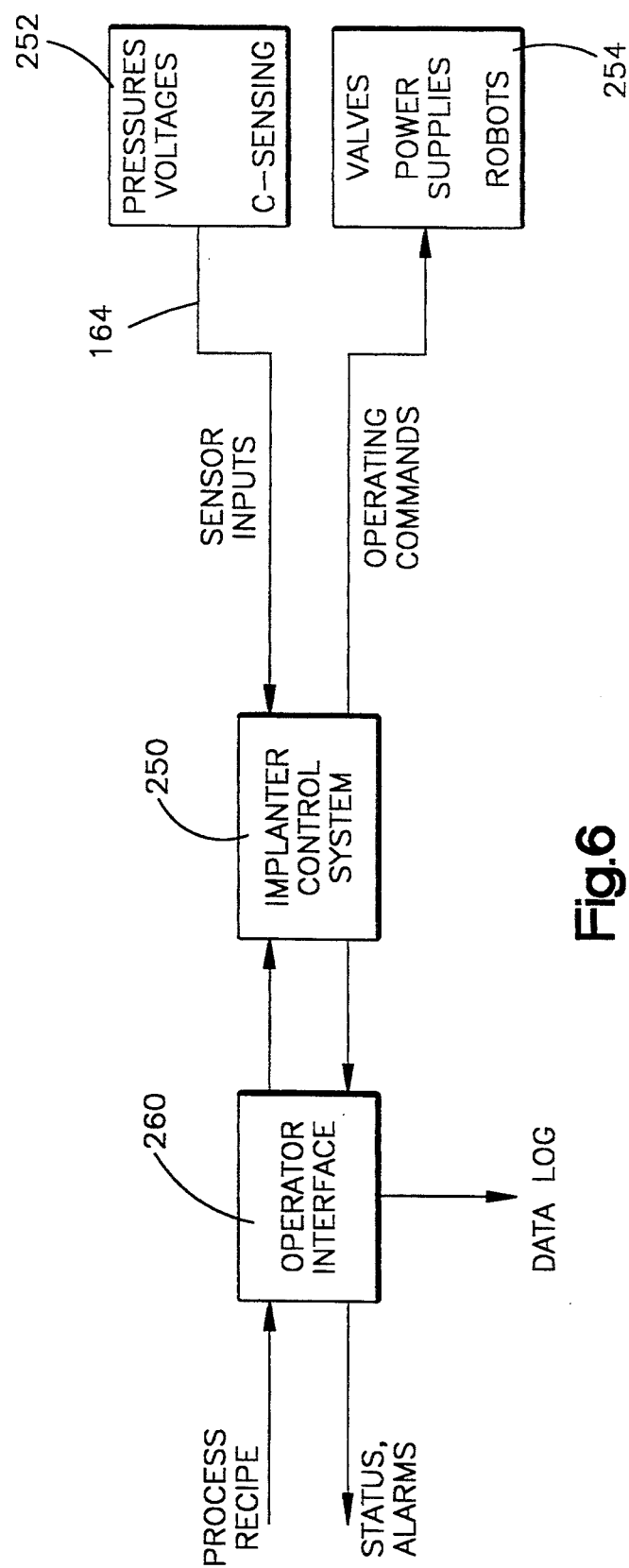
FIG. 6 is a schematic of a control system that utilizes an output of the capacitance sensing circuit of FIGS. 4 and 4A to control an ion implanter.
Figure 7:
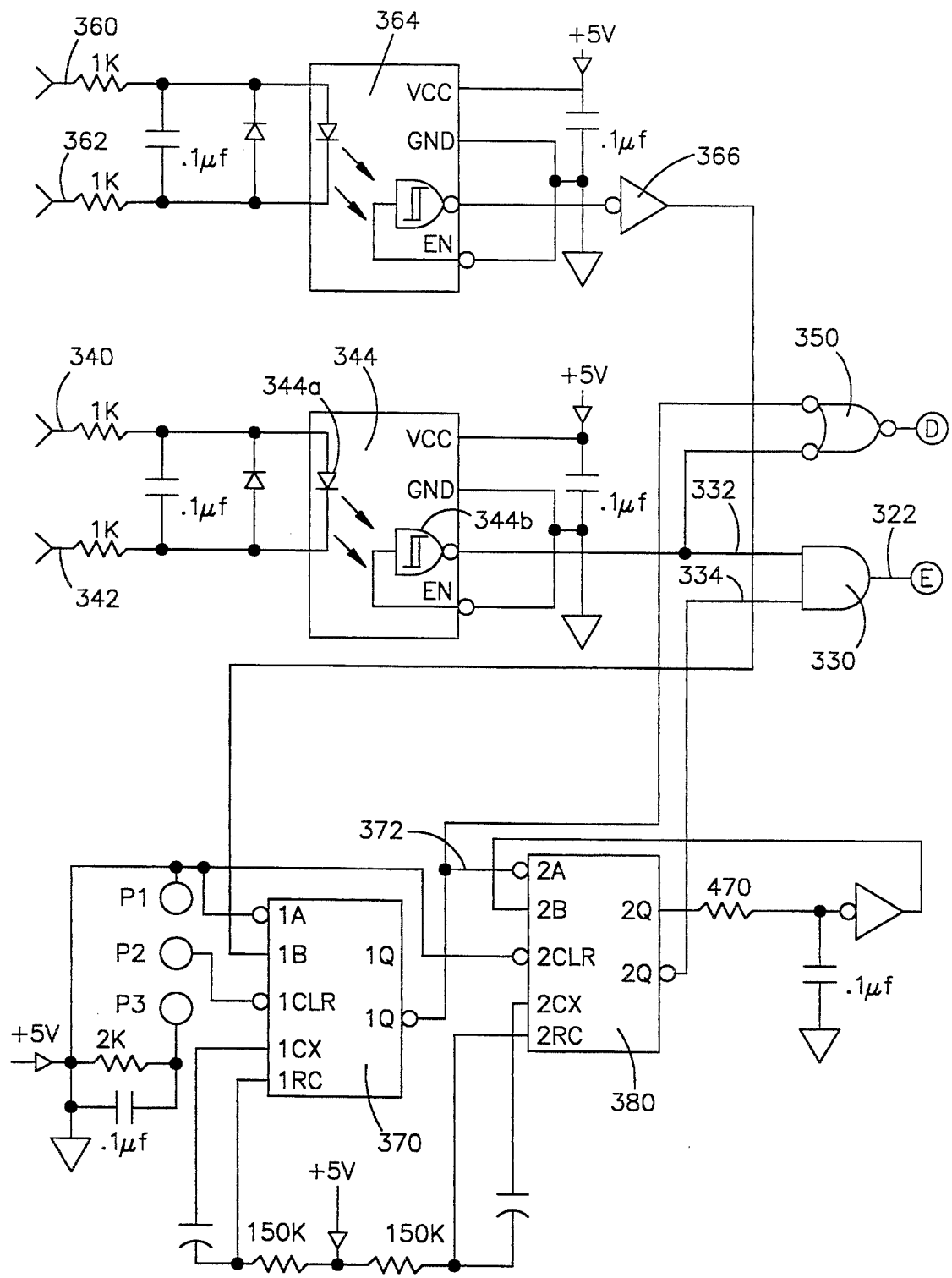
FIGS. 7 and 8 are schematics of circuitry for controlling a polarity of an output from the power supply shown in FIG. 1.
Figure 8:
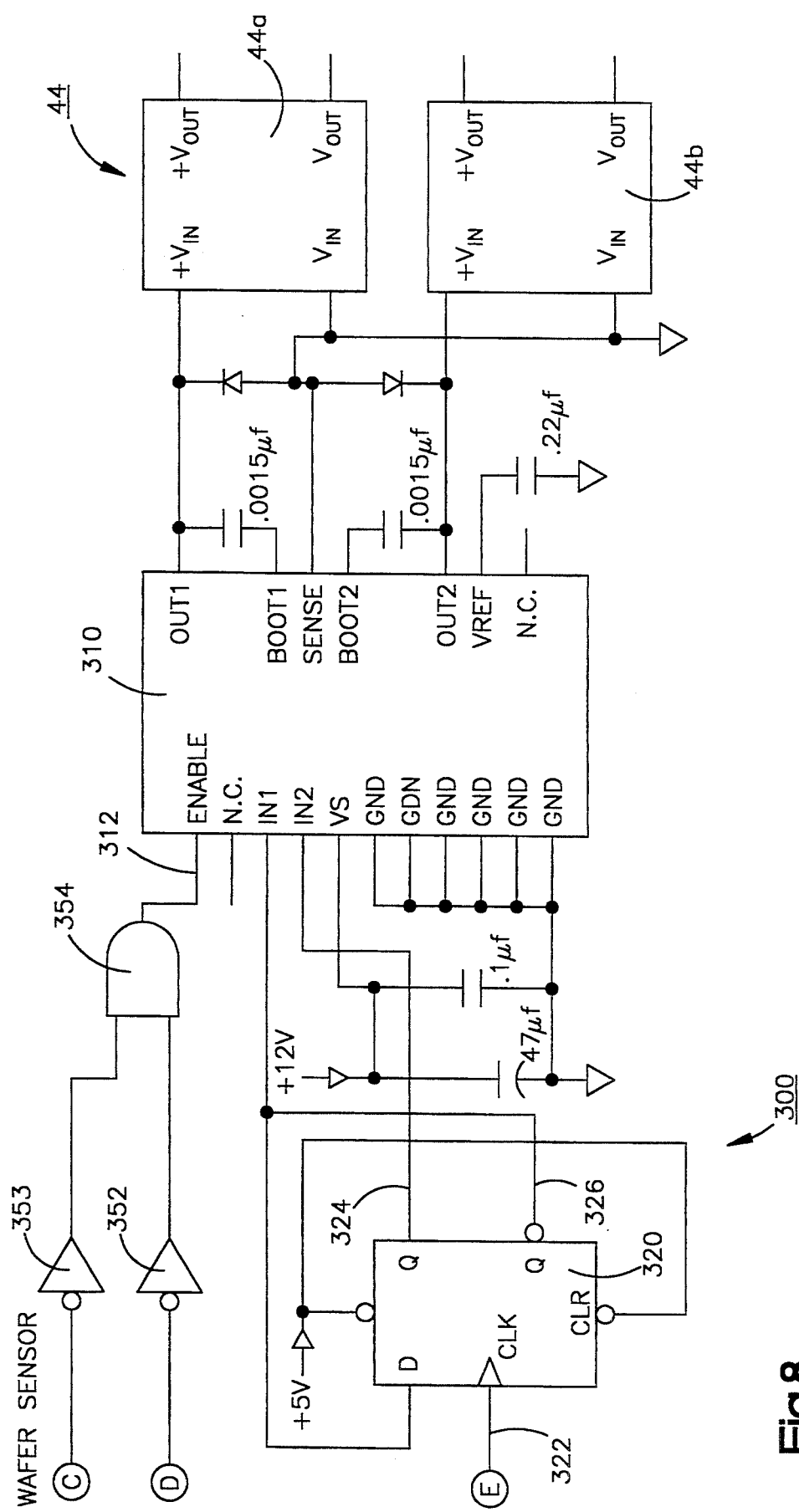

The implanter control system 250 of FIG. 6 interfaces with a wafer release circuit 300 depicted in FIGS. 7 and 8 that activates the power supply 44 with the bi-polar output configuration. The circuit 300 includes a logic driver circuit 310 having two outputs OUT1, OUT2 coupled to two power supply modules 44a, 44b. The power supply modules are preferably MC-30 power supplies commercially available from Gamma High Voltage of Ormond Beach, Fla. Two inputs IN1, IN2 control the outputs OUT1, OUT2. When IN1 is positive, the output OUT1 from the logic circuit 310 is positive and acts as a current source so a first power supply module 44a is activated. When this happens, the voltage across the two electrodes mounted to the wafer support is of a first polarity. When IN2 is positive, the output designated OUT2 from the logic circuit 310 is positive and acts as a current source and the second switching power supply module 44b is active so the polarity of the voltage across the electrodes is switched. The circuit 310 is commercially available from SGS Thompson under part designation L6202.

After a wafer is placed on the support layer 20, prior to wafer implantation, one module of the power supply 44 is activated to maintain an electrostatic attraction between wafer and support. To accomplish this, an ENABLE input 312 to the circuit 310 is high and one or the other of the inputs IN1, IN2 remains positive during ion implantation. This causes a fixed voltage to be applied to the electrodes 22, 24 maintaining electrostatic attraction between the wafer and the support.

When the wafer is to be released from the support, the enable input ENABLE to the circuit 310 remains high, but the two inputs IN1, IN2 are alternately turned on and off by means of the Q and not Q outputs from a flip-flop 320. The frequency at which the polarity of the power supply is switched is controlled by an input 322 to the flip-flop 320. The flip-flop is configured as a divide-by-two counter so that if the signal at the input has a frequency f, the outputs change state at a frequency of f/2. When the Q and not Q outputs switch, a different one of the modules 44a, 44b is activated, effecting a switching of polarity across the electrodes within the wafer support.

Turning now to FIG. 7, the input 322 to the flip-flop 320 originates from an AND gate 330 having two inputs 332, 334. One input 332 to the AND gate 330 depends upon control signal from the controller 250 which is applied across two inputs 340, 342 to an optoisolator 344. When an input 340 is positive with respect to the input 342, current flows through a light-emitting diode 344a within the optoisolator, activating a photosensor 344b. This generates a low output which is coupled to the input 332. The voltage across the two inputs 340, 342 is applied by the controller 250 when the controller has sensed the presence of a wafer on the support and responds to this sensed condition by activating the electrostatic attraction between the wafer and the support.

When a clamp activation voltage is applied by the controller 250 to the inputs 340, 342, the signal on the input 332 to the AND gate 330 goes low causing the output from the AND gate 330 to go low and maintain the flip-flop 320 in one state (which state is not important during clamping). As seen in FIG. 7, this low output signal from the optoisolator 344 is also applied to a negative OR gate 350 having an output coupled through an invertor 352 to an AND gate 354 (FIG. 8). A low output from the optoisolator 344 causes the AND gate 354 output to go high, causing the enable input 312 of the logic driver circuit 310 to receive an activation signal. The state of the two inputs IN1, IN2 causes one or the other of the modules 44a, 44b to be activated so that a voltage difference is applied to the electrodes within the wafer support. This activates electrostatic attraction between the wafer support and wafer. A second input to the AND gate 354 from an invertor 353 receives a hardware generated wafer sense signal derived from the FVOUT signal 164.

Subsequent to ion implantation, the controller 250 de-activates the electrostatic attraction by providing a control signal to cause the polarity of the voltage applied to the wafer electrodes to change back and forth, thereby dissipating the electrostatic energy between wafer and electrode.

When the controller 250 de-activates wafer clamping, the output signal from the optoisolator 344 goes high, therefore, assuring one input 332 to the AND gate 330 is also high. Two additional controller generated inputs 360, 362 are coupled to a second optoisolator 364. When the voltage at the input 360 is more positive than the voltage at the input 362, this second optoisolator 364 is activated and a low output from the optoisolator is coupled through an invertor 366 and, therefore, goes high. This high-input signal is coupled to a first one-shot 370, causing a Q output for the one-shot 370 to go high. The not Q output 372 simultaneously goes low and is coupled to the gate 350 for enabling the drive circuit 310. Thus, even though the signal 340 from the controller is removed, the drive circuit is still enabled. The Q output from the one-shot 370 is coupled to a second one-shot 380 which is configured as an oscillator circuit. The Q output from this one-shot is fed back to the activation input through an external circuit which causes the second one-shot 380 to oscillate with a predetermined frequency of approximately 20 Hz. This causes the input 334 to the AND gate 330 to be pulsed at this frequency. As noted above, the output of the AND gate 330 is coupled to the flip-flop which acts as a divide-by-two counter. This causes the polarity on the electrodes to oscillate back and forth for a time period equal to the output time of the first one-shot 370. After the one-shot 370 times out, the Q output from this one-shot de-activates the oscillator one-shot 380 and also removes the enable signal from the circuit 310.

In accordance with a second embodiment of the controlled release mechanism of the invention, the controller 250 directly activates the inputs 340, 342 for controlled ON/OFF intervals. The junction 322 is low when the input 340 is high. By clocking the input 340 at a controlled or adjustable rate, the frequency of switching from the circuit 310 is controlled which, in turn, controls the polarity switching of the two power supply modules 44a, 44b. Three jumper connections P1, P2, P3 at the input to the one-shot 370 are set depending on whether the controller performs the switching or the combination of one-shot 370 and multivibrator 380 control the switching. A jumper across P1 and P2 disables the one-shot 370, and a jumper across P2, P3 enables the one-shot.

Operation

In operation, a wafer 12, which is to be processed, is placed upon the surface of the layer 20, and the supply 44 will be energized to apply an electrostatic attractive force between the wafer and the layer 20 sufficient to maintain the wafer in position on the chuck. The chuck 10 can then be both rotated and translated to bring the wafer to a wafer treatment station such as an ion implantation chamber.

The implanter control system 250 (FIG. 6) has a large number of device interfaces which receive inputs from sensors 252 (for example, gauges measuring pressures, voltmeters, encoders measuring mechanical position, and the FVOUT output 164), and send operating commands to mechanical and electrical components 254 (for example, valves, power supplies, robots, and the electrostatic clamp power supply 44).

Within the control system there are programmed a variety of cross checks which must be performed before sending an operating command (for example, the valve to a cryopump cannot be opened unless it is verified that the chamber is already under rough vacuum). The output 164 indicates the wafer's presence and whether it is clamped and provides critical information for these cross checks to implement wafer handling and implantation operations. For example, the assembly 10 would not be rotated into a vertical position unless the wafer was verified to be securely clamped. Similarly, the clamp would not be activated unless the wafer's presence on the clamp was verified. When a critical cross check fails, the control system 250 has the ability to place the implanter into HOLD (suspend further operation) in order to avoid damage to the machine or to produce wafers.

A second function of the series of cross checks is to provide an operator interface 260 information about machine status. The interface 260 (FIG. 6) includes a process recipe input and status alarm and data log outputs. Specifically, when a cross check fails, an alarm message is generated for display on an operator interface screen, and is recorded in a data log maintained on a disk drive. This information permits an operator to take corrective action to restore normal machine operation.

Once the wafer has been ion treated, the assembly 10 is moved to position the wafer for removal from the support. The controller 250 then either signals the one-shot 370 to activate polarity reversal of the power supply 40 or directly switches that polarity at a controlled frequency. The electrodes are biased with alternating polarity and release the wafer by reducing electrostatic attraction between the wafer support and the wafer.

FIG. 6 represents current state-of-the-art for control equipment. The addition of the capacitive sensing circuit 114 and the wafer release circuit 300 represents an advance in the quality of information available about the status of the wafer on the clamp 10 and the ability to efficiently treat wafers.

While the preferred embodiment of the invention has been described with a degree of particularity, it is the intent that the invention include all modifications and alterations from the disclosed design falling within the spirit or scope of the appended claims.

We claim:

1. A wafer handling method for use in treatment of a semiconductor wafer comprising the steps of:
    a) placing a semiconductor wafer on a wafer support;
    b) once the wafer is placed on the wafer support, electrostatically attracting the wafer to the support by electrically biasing the wafer support with a first polarity DC signal to create an electrostatic attraction between the semiconductor wafer and the wafer support;
    c) treating the wafer while maintaining the electrical bias with the first polarity DC signal to maintain an attraction between the wafer and the wafer support; and
    d) releasing a treated wafer from the wafer support by applying a second DC polarity signal to the wafer support that is opposite in polarity to the first polarity DC signal, and then applying alternating signals having the first and second polarities at a controlled frequency for a predetermined time interval to reduce the electrostatic attraction between the wafer and the wafer support.

2. The wafer handling method set forth in claim 1 additionally comprising the step of detecting a presence of a wafer on the wafer support prior to treatment of the wafer.

3. The wafer handling method set forth in claim 2 wherein the step of detecting a presence of a wafer on the wafer support includes sensing a capacitance between two spaced apart electrodes coupled to the wafer support.

4. The wafer handling method set forth in claim 1 additionally comprising the step of removing the treated wafer from the wafer support.

5. Wafer treatment apparatus for supporting a semiconductor wafer comprising:
    a) a wafer support including a dielectric surface that engages the wafer and two electrodes;

b) a power supply for energizing the two electrodes comprising circuitry for providing controlled first and second polarity bias signals across the electrodes; and c) an implantation control system coupled to the power supply including circuitry for securing the wafer to the wafer support during ion implantation by applying one of the first and second polarity bias signals across the electrodes thereby electrostatically attracting the wafer to the wafer support and for releasing the wafer from the wafer support after implantation of the wafer is complete by alternately applying the first and second polarity bias signals to the electrodes at a controlled frequency for a predetermined time interval to reduce the electrostatic attraction of the wafer to the wafer support.

6. The apparatus of claim 5 additionally comprising sensor circuitry to sense an attraction between the wafer and the wafer support produced by the power supply based upon sensed capacitance between the electrodes when the power supply energizes the electrodes.

7. The apparatus of claim 5 wherein the controller comprises an oscillator circuit coupled to the power supply to change the bias on the electrodes at the controlled frequency for a controlled time interval.

8. The wafer treatment apparatus of claim 5 further including capacitance sense circuitry means for detecting a presence or absence of the wafer on the wafer support by sensing a capacitance between the two electrodes.

9. The wafer treatment apparatus of claim 8 wherein the capacitance sense circuitry means produces an output signal indicative of the presence of the wafer on the wafer support, the output signal being coupled to the implantation control system such that the electrodes are be energized only when the output signal indicates a wafer is present on the wafer support.

10. The wafer treatment apparatus of claim 5 wherein the dielectric surface is comprised of alumina.

11. The wafer treatment apparatus of claim 5 wherein the power supply comprises two supply modules and the implantation control system circuitry includes a logic driver circuit having first and second complementary outputs, each output coupled to a different one of the bi-polar output power supply modules such that when one of the first and second driver outputs is logic high the supply module coupled to the high driver output applies a signal to the electrodes and the other of the first and second driver outputs is logic low, the supply module coupled to the low driver output being disabled.

12. Apparatus for use in ion implantation of semiconductor wafers comprising:

a) a dielectric layer for supporting a semiconductor wafer;

b) a base member supporting said dielectric layer;

c) first and second electrodes positioned behind said dielectric layer and supported within said base member;

d) means for securing the wafer to the dielectric layer by applying a non-pulsing first polarity DC bias signal to said first and second electrodes to create an electrostatic attractive force between said dielectric layer and said wafer; and e) means for sensing a capacitance between the first and second electrodes and monitoring a change in said capacitance as the wafer is placed on the dielectric layer and for further monitoring a change in said capacitance as the wafer is held in place by the electrostatic attractive force between the wafer and the first and second electrodes; and f) means for releasing the wafer from the dielectric layer by applying a second non-pulsing DC polarity that is opposite to the first polarity and then alternating the first and second polarity DC bias signals at a controlled frequency for a predetermined time interval.

13. The apparatus of claim 12 additionally comprising a controller for controlling a rate at which the power supply changes the polarity of the bias applied to said electrodes.

14. The apparatus of claim 13 where the controller comprises an oscillator that switches the polarity at a clock frequency based upon an oscillator frequency.

15. The apparatus of claim 12 wherein the means for securing the wafer to the dielectric layer comprises two power supply modules coupled together and further comprises a power supply controller for rendering one or the other of said two power supply modules active to control the polarity of the signal across the first and second electrodes.

16. A wafer handling method for use in treatment of a semiconductor wafer comprising the steps of:

a) placing a semiconductor wafer on a wafer support;

b) once the wafer is on the wafer support, securing the wafer to the support by enabling one of two power supply modules resulting in a non-pulsing DC waveform of a first polarity being placed across the electrodes;

c) treating the wafer while maintaining the attraction between the wafer and the wafer support; and d) removing the wafer from the wafer support by enabling the other of the two power supply modules such that the other module, when activated, places a second polarity across the electrodes that is opposite to the first polarity, and then alternating the first and second polarities at a controlled frequency for a predetermined period of time.

17. Apparatus for use in ion implantation of semiconductor wafers comprising:

a) a dielectric layer for supporting a semiconductor wafer;

b) a base member supporting said dielectric layer;

c) first and second electrodes positioned behind said dielectric layer and supported within said base member;

d) power supply means for applying an electric potential to said first and second electrodes to create an electrostatic attractive force between said dielectric layer and said wafer;

e) means for sensing capacitance between the first and second electrodes and monitoring a change in said capacitance as the wafer is placed on the dielectric layer and for further monitoring a change in said capacitance as the wafer is held in place by the electrostatic attractive force between the wafer and the first and second electrodes; and f) said power supply means comprising two power supply modules coupled together and further comprising a power supply controller for rendering one of said two power supply modules active to produce a nonpulsing DC waveform of a first polarity across the first and second electrodes to secure the wafer to the dielectric layer, and for rendering the other of said two power supply modules active to place a second polarity across the first and second electrodes that is opposite to the first polarity, and then alternating the first and second polarities at a controlled frequency for a predetermined period of time to release the wafer from the dielectric layer.

* * * * *